United States Patent
Shih et al.

(10) Patent No.: US 8,633,099 B1
(45) Date of Patent: Jan. 21, 2014

(54) METHOD FOR FORMING INTERLAYER CONNECTORS IN A THREE-DIMENSIONAL STACKED IC DEVICE

(75) Inventors: Yen-Hao Shih, Elmsford, NY (US); Shih-Hung Chen, Hsinchu County (TW); Teng-Hao Yeh, Hsinchu (TW); Chih-Wei Hu, Miaoli County (TW); Feng-Nien Tsai, New Taipei (TW); Lo-Yueh Lin, Yilan County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/607,555

(22) Filed: Sep. 7, 2012

Related U.S. Application Data

(60) Provisional application No. 61/673,688, filed on Jul. 19, 2012.

(51) Int. Cl.
  *H01L 21/44* (2006.01)
  *H01L 21/4763* (2006.01)
  *H01L 23/48* (2006.01)
  *H01L 29/40* (2006.01)

(52) U.S. Cl.
  USPC ............ 438/598; 438/620; 438/622; 257/758

(58) Field of Classification Search
  None
  See application file for complete search history.

(56) References Cited

U.S. PATENT DOCUMENTS

| | | | |
|---|---|---|---|
| 6,034,882 A | 3/2000 | Johnson et al. |
| 6,906,361 B2 | 6/2005 | Zhang |
| 6,906,940 B1 | 6/2005 | Lue |
| 7,081,377 B2 | 7/2006 | Cleeves |
| 7,129,538 B2 | 10/2006 | Lee et al. |
| 7,177,169 B2 | 2/2007 | Scheuerlein |
| 7,274,594 B2 | 9/2007 | Pascucci et al. |
| 7,315,474 B2 | 1/2008 | Lue |
| 7,382,647 B1 | 6/2008 | Gopalakrishnan |
| 7,420,242 B2 | 9/2008 | Lung |
| 7,851,849 B2 | 12/2010 | Kiyotoshi |
| 7,855,457 B2 | 12/2010 | Mizukami et al. |

(Continued)

FOREIGN PATENT DOCUMENTS

| EP | 1936681 A1 | 6/2008 |
|---|---|---|
| EP | 2048709 A2 | 4/2009 |

OTHER PUBLICATIONS

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

(Continued)

*Primary Examiner* — Scott B Geyer
(74) *Attorney, Agent, or Firm* — James F. Hann; Haynes Beffel & Wolfeld LLP

(57) ABSTRACT

A method is used with an IC device including a stack of dielectric/conductive layers to form interlayer connectors extending from a surface of the device to the conductive layers. Contact openings are created through a dielectric layer to a first conductive layer. N etch masks, with $2^{N-1}$ being less than W, $2^N$ being greater than or equal to W, have spaced apart open etch regions and mask regions elsewhere. The stack of layers are etched only through W−1 contact openings to create extended contact openings extending to W−1 conductive layers; $2^{n-1}$ conductive layers are etched for up to half of the contact openings for each etch mask n=1, 2 ... N. The contact openings are etched with different combinations of the etch masks' open etch regions. Interlayer connectors are formed in the contact openings.

19 Claims, 8 Drawing Sheets

(56) References Cited

U.S. PATENT DOCUMENTS

| | | |
|---|---|---|
| 8,383,512 B2 | 2/2013 | Chen et al. |
| 2005/0280061 A1 | 12/2005 | Lee |
| 2006/0091556 A1 | 5/2006 | Shigeoka |
| 2007/0140001 A1 | 6/2007 | Motoi et al. |
| 2008/0073635 A1 | 3/2008 | Kiyotoshi et al. |
| 2008/0096327 A1 | 4/2008 | Lee et al. |
| 2008/0101109 A1 | 5/2008 | Haring-Bolivar et al. |
| 2008/0175032 A1 | 7/2008 | Tanaka et al. |
| 2008/0180994 A1 | 7/2008 | Katsumata et al. |
| 2008/0247230 A1 | 10/2008 | Lee et al. |
| 2008/0285350 A1 | 11/2008 | Yeh |
| 2009/0097321 A1 | 4/2009 | Kim et al. |
| 2009/0184360 A1 | 7/2009 | Jin et al. |
| 2010/0013049 A1 | 1/2010 | Tanaka et al. |
| 2010/0184295 A1 | 7/2010 | Sato et al. |
| 2010/0270593 A1 | 10/2010 | Lung et al. |
| 2011/0284946 A1 | 11/2011 | Kiyotoshi |
| 2012/0184097 A1 | 7/2012 | Chen et al. |

OTHER PUBLICATIONS

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Paul et al., "Impact of a Process Variation on Nanowire and Nanotube Device Performance," IEEE Trans. on Electron Devices, vol. 54, No. 9, Sep. 2007, pp. 2369-2376.

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Fukuzumi et al. "Optimal Integration and Characteristics of Vertical Array Devices for Ultra-High Density, Bit-Cost Scalable Flash Memory," IEEE Dec. 2007, pp. 449-452.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

U.S. Appl. No. 13/451,428, filed Apr 19, 2012, "Integrated Circuit Capacitor and Method," 35 pp.

U.S. Appl. No. 13/451,411, filed Apr. 19, 2012, "Method for Creating a 3D Stacked Multichip Module," 43 pp.

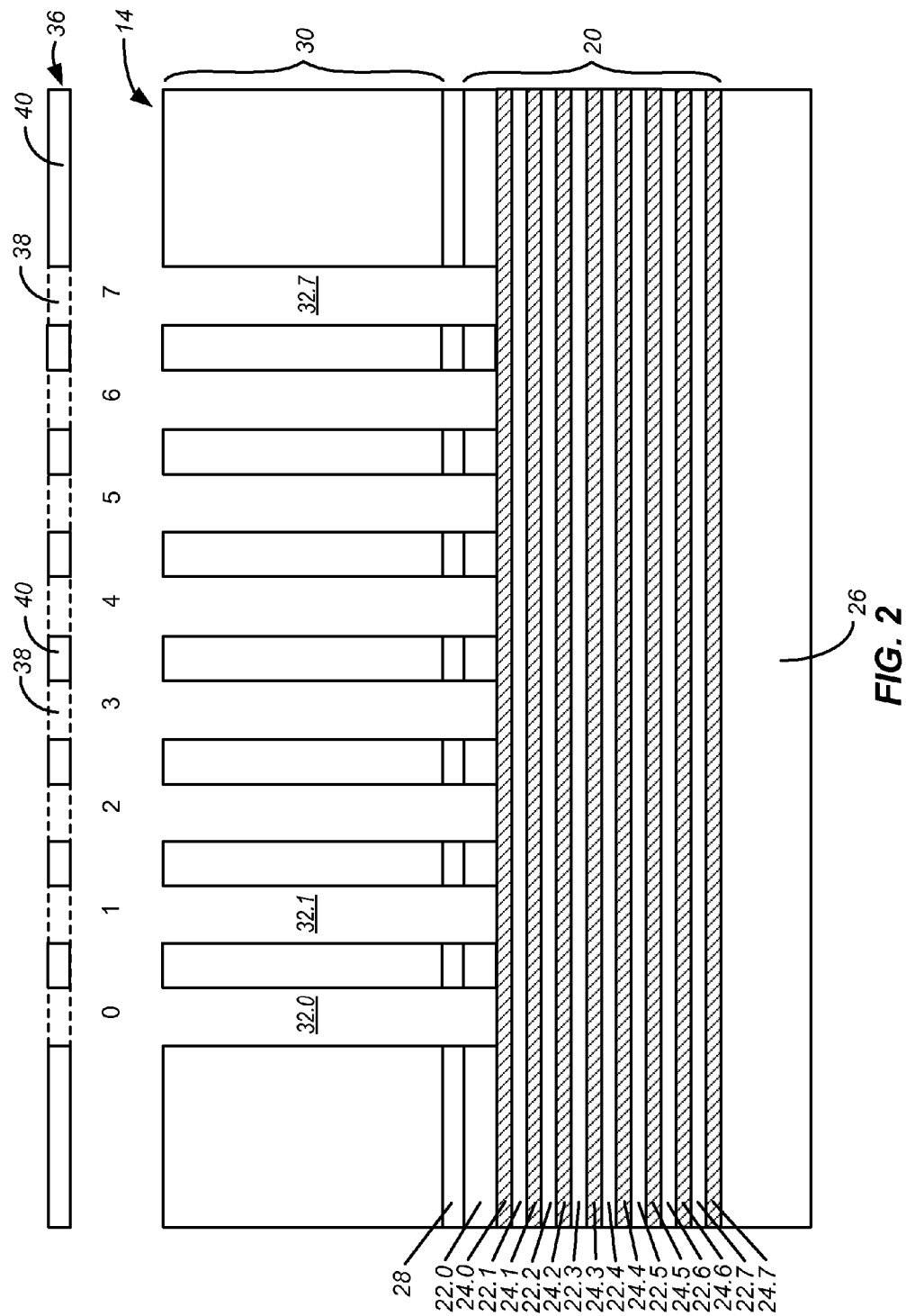

METHOD FOR FORMING INTERLAYER CONNECTORS IN A THREE-DIMENSIONAL STACKED IC DEVICE

CROSS-REFERENCE TO RELATED APPLICATIONS

This application claims benefit of U.S. Provisional Patent Application No. 61/673,688, filed 19 Jul. 2012.

This application is related to the following co-pending U.S. patent applications: U.S. patent application Ser. No. 13/049,303, filed 16 Mar. 2011, entitled REDUCED NUMBER OF MASK FOR IC DEVICE WITH STACKED CONTACT LEVELS; U.S. patent application Ser. No. 13/114,931, filed 24 May 2011, entitled MULTILAYER CONNECTION STRUCTURE AND MAKING METHOD; U.S. patent application Ser. No. 13/451,411, filed 19 Apr. 2012, entitled METHOD FOR CREATING A 3D STACKED MULTICHIP MODULE; and U.S. patent application Ser. No. 13/451,428, filed 19 Apr. 2012, entitled INTEGRATED CIRCUIT CAPACITOR AND METHOD, the disclosures of which are incorporated by reference. These four applications and the present application have a common assignee.

BACKGROUND OF THE INVENTION

1. Field of the Invention

The present invention relates generally to high density integrated circuit devices, and more particularly to interconnect structures for multi-level three-dimensional stacked devices.

2. Description of Related Art

In the manufacturing of high density memory devices, the amount of data per unit area on an integrated circuit can be a critical factor. Thus, as the critical dimensions of the memory devices approach lithographic technology limits, techniques for stacking multiple levels of memory cells have been proposed in order to achieve greater storage density and lower costs per bit.

For example, thin film transistor techniques are applied to charge trapping memory in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells," IEEE J. of Solid-State Circuits, Vol. 38, No. 11, November 2003. See, also U.S. Pat. No. 7,081,377 to Cleeves entitled "Three-Dimensional Memory."

Another structure that provides vertical NAND cells in a charge trapping memory technology is described in "Novel 3-D Structure for Ultra-High Density Flash Memory with VRAT and PIPE," by Kim et al., 2008 Symposium on VLSI Technology Digest of Technical Papers;" 17-19 Jun. 2008; pages 122-123.

In three-dimensional (3-D) stacked memory devices, conductive interconnects used to couple the lower levels of memory cells to decoding circuitry and the like pass through the upper levels. The cost to implement the interconnections increases with the number of lithographic steps needed. One approach to reduce the number of lithographic steps is described in Tanaka et al., "Bit Cost Scalable Technology with Punch and Plug Process for Ultra High Density Flash Memory," 2007 Symposium on VLSI Technology Digest of Technical Papers; 12-14 Jun. 2007; pages 14-15.

However, one of the drawbacks with conventional 3-D stacked memory devices is that a separate mask is typically used for each contact level. Therefore, if there are, for example, 20 contact levels, 20 different masks are commonly required, each contact level requiring the creation of a mask for that level and an etching step for that level.

SUMMARY OF THE INVENTION

According to some examples of the present invention, it only requires N masks to provide access to $2^N$ electrically conductive layers. According to some examples, $2^{n-1}$ electrically conductive layers are etched for each mask sequence number n. In some examples, the etch masks have separate open etch regions positioned to overlie only selected contact openings and mask the other portions of the dielectric layer.

A first example of a method, for use with an integrated circuit device including a stack of dielectric/conductive layers, forms interlayer connectors extending from a surface of the device to the conductive layers. The method is carried out as follows. Spaced apart contact openings are created in a contact region of the integrated circuit through a dielectric layer with dielectric layer material separating each of the contact openings and the contact openings overlying an electrical conductor for each of W conductive layers. Creating the contact openings also creates a first contact opening down to a first conductive layer. A set of N etch masks are used, with $2^{N-1}$ being less than W (the number of the total conductive layers), $2^N$ being greater than or equal to W, and the etch masks having spaced apart open etch regions corresponding to selected contact openings and mask regions elsewhere. Using the N etch masks, the stack of dielectric/conductive layers are etched only through W−1 contact openings to create extended contact openings extending to W−1 conductive layers. During the $n^{th}$ etching, $2^{n-1}$ conductive layers are etched for up to half of the contact openings for each etch mask n=1, 2 . . . N. The etching is carried out so that the contact openings are etched with different combinations of the open etch regions of the etch masks. Interlayer connectors are formed in the first contact opening and in the extended contact openings to electrically connect to each of the conductive layers.

Examples of the method may include one or more of the following. The N etch masks may be configured so that the dielectric material surrounding the contact openings is substantially unaffected during the etching step. The contact openings may be etched so that at least some interlayer connectors terminate at electrical conductors located at least two levels from the electrical conductors to which adjacent interlayer connectors terminate. The interlayer connectors may have a range of sizes from greater depths to average depths to shallower depths with a first interlayer connector having a greater depth being adjacent to a second interlayer connector having a shallower depth, and with third and fourth interlayer connectors having average depths being adjacent to one another.

An example of an integrated circuit device includes a stack of alternating dielectric layers and electrically conductive layers including upper and lower electrically conductive layers. An overlying layer is over the upper electrically conductive layer, the overlying layer having an upper surface. Interlayer connectors extend from the upper surface of the overlying layer to respective ones of the electrically conductive layers to make electrical contact therewith. The interlayer connectors are separated from one another by an average pitch. The interlayer connectors have a range of depths from greater depths to average depths to shallower depths. A first interlayer connector, having a greater depth, is adjacent to a second interlayer connector, having a shallower depth. Third and fourth interlayer connectors, having generally average depths, are adjacent to one another.

Examples of the integrated circuit device may include one or more of the following. The first interlayer connector may have the greatest depth among the interlayer connectors, and the second interlayer connector may have the shallowest depth among the interlayer connectors. The pitch between adjacent interlayer connectors may be a substantially constant pitch.

Other aspects and advantages of the present invention can be seen on review of the drawings, the detailed description, and the claims which follow.

BRIEF DESCRIPTION OF THE DRAWINGS

FIG. 5 also shows the contact region photoresist mask and the first and second photoresist masks so that the relationships among the open etch regions of each can be easily seen.

DETAILED DESCRIPTION

Figure 1:
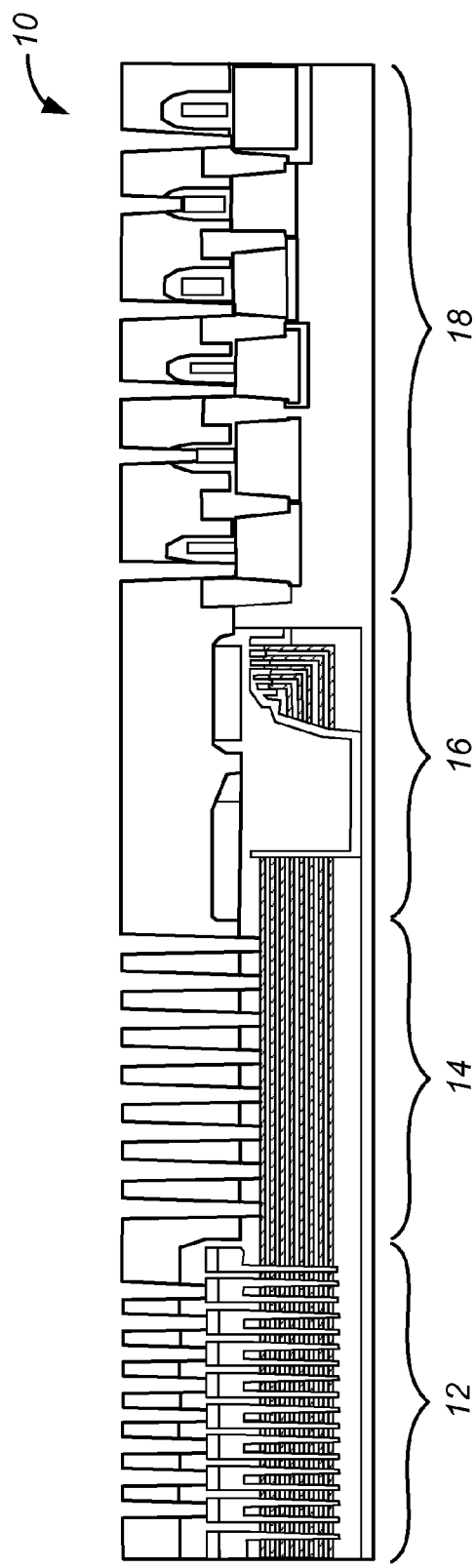
FIG. 1 is a simplified cross-sectional view of one example of an integrated circuit device including a vertical contact region to be processed according to the present invention.

FIG. 1 is a simplified cross-sectional view of one example of an integrated circuit device 10 including a memory cell region 12, a vertical contact region 14, an array/periphery boundary region 16 and a periphery CMOS devices region 18. The present invention will be concerned with vertical contact region 14. Device 10 is illustrated as an example of one type of integrated circuit device with which the present invention can be used; others are also possible.

Referring also to FIG. 2, vertical contact region 14 includes a stack 20 of alternating dielectric layers 22 and electrically conductive layers 24 over dielectric substrate 26. In this example, there are eight pairs of dielectric layers 22 and electrically conductive layers 24 identified as dielectric layers 22.0 through 22.7 and electrically conductive layers 24.0 through 24.7. Dielectric layers 22 can be an oxide, nitride, oxynitride, silicate, or others. Low dielectric constant materials having a dielectric constant smaller than that of silicon dioxide, such as $SiCHO_x$, may be preferred. High dielectric constant (high-k) materials having a dielectric constant greater than that of silicon dioxide, such as $HfO_x$, HfON, $AlO_x$, $RuO_x$, $TiO_x$, may be included also. Electrically conductive layers 24 can be electrically conductive semiconductors including heavily doped polysilicon (using dopants such as As, P, B), silicides including TiSi, CoSi, oxide semiconductors, including InZnO, InGaZnO, and combinations of semiconductors and silicides. Electrically conductive layers 24 can also be a metal, a conductive compound, or combinations of materials including Al, Cu, W, Ti, Co, Ni, TiN, TaN, TaAlN, and others.

An etch stop layer 28, typically of SiN, is located above stack 20 with an interlayer dielectric 30 above layer 28. Interlayer dielectric 30 can be made of $SiO_2$, PSG, BPSG, or the combination of them, and acts as a non-disposable hard mask as will be evident from the discussion below. The etch stop layer 28 is selected for its ability to be used for an etching-synchronizing function as discussed below, and cannot be SiN when the hard mask 30 is SiN.

FIGS. 2-5 illustrate the steps used to create contact openings 32, identified in the figures at locations 0-7, and extended contact openings 34, see FIGS. 3-7, at vertical contact region 14. Vertical contact region 14 shown in FIG. 2 is in the same state as shown in FIG. 1. In addition, FIG. 2 illustrates the contact openings photoresist mask 36 having open etch regions 38 and closed mask regions 40. Using contact opening photoresist resist mask 36, contact openings 32 are etched through hard mask 30, etch stop layer 28 and first dielectric layer 22.0 stopping at first electrically conductive layer 24.0. In this example, there are eight open etch regions 38 used to create eight contact openings 32, one for each of the eight electrically conductive layers 24. The number of electrically conductive layers 24 may be referred to as W. The etching using contact opening photoresist mask 36, sometimes referred to as CO (contact opening) base etching can be carried out on the silicon nitride/poly silicon/silicon oxide layers using, for example, reactive ion etching using an etch chemistry, for example, including CF4/C5F8/CH2F2/O2/Ar, stopping on top of the electrically conductive layer 24.0. Other procedures may also be used to create contact openings 32. The creation of contact openings 32 provides a pattern of openings for the subsequent etching steps.

In FIGS. 2-5 open etch regions 38 are shown as simple openings formed in mask 36 for sake of simplicity. In practice, nonlinear optics may require complicated patterns to be formed in photoresist masks to create the desired image on the upper surface 48 of hard mask 30. Therefore, the size and shape of open etch regions 38 may not correspond to the size and shape of the images 41, see FIG. 2A, directed onto upper surface 48 of hard mask 30 prior to forming the set of contact openings 32 at the locations of images 41. In the example of FIG. 2A, the images 41 directed onto upper surface 48 are basically square and are arranged in a pattern so to provide better separation between the resulting contact openings 32. Other patterns of images 41 can also be used. The enhanced separation provided by the example of FIG. 2A is also useful to accommodate both the open etch regions 38 and other features on the photoresist mask, such as scattering bars.

Open etch regions 38 and contact openings 32 are shown arranged in straight lines in the remaining figures in this application for ease of illustration. The size of images 41 projected onto the upper surface 48 will typically be somewhat larger than the subsequent images projected using first, second and third photoresist masks 42, 44 and 46. This accommodates slight misalignments which can occur during the subsequent imaging and etching steps to help prevent erosion of the dielectric material surrounding contact openings 32. The shape of images 41 can be other than square, such as rectangular, round or oval. The cross-sectional shape of the contact openings 32 created during etching will generally follow the shape of images 41.

Figure 2A:
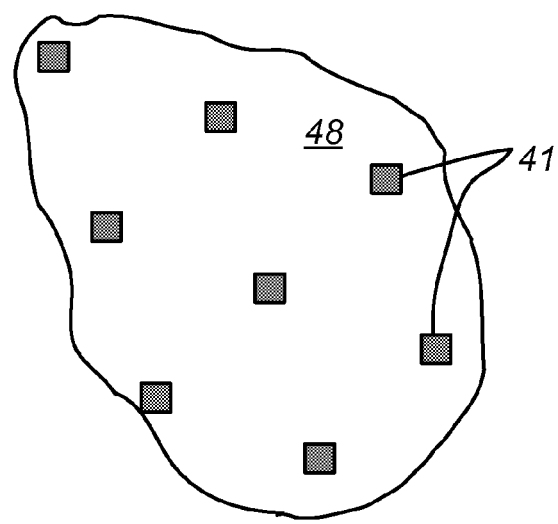
FIG. 2 illustrates contact openings created in the vertical contact region using a contact region photoresist mask.
Figure 5A:
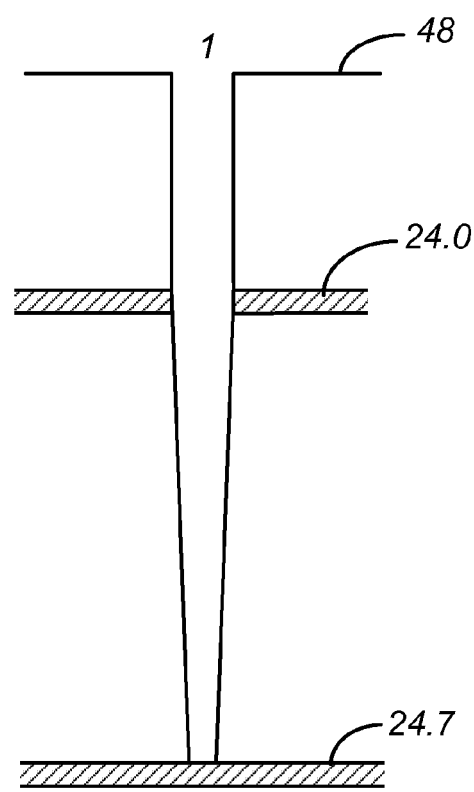
FIG. 5 illustrates a third photoresist mask used to etch through one electrically conductive layer through a third set of contact openings.
Figure 3:
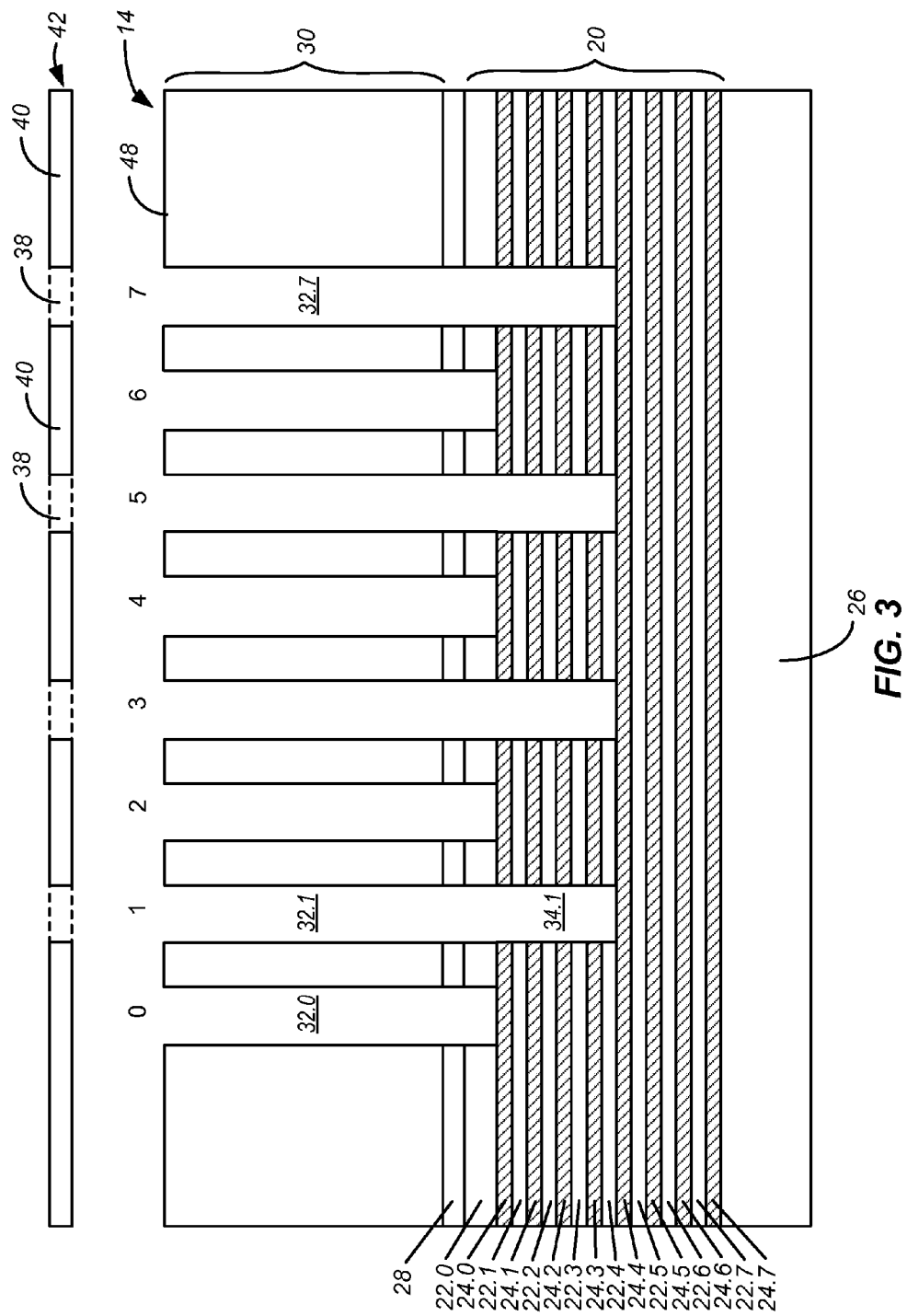
FIG. 3 illustrates a first photoresist mask used to etch through four electrically conductive layers through a first set of the contact openings.
Figure 4:
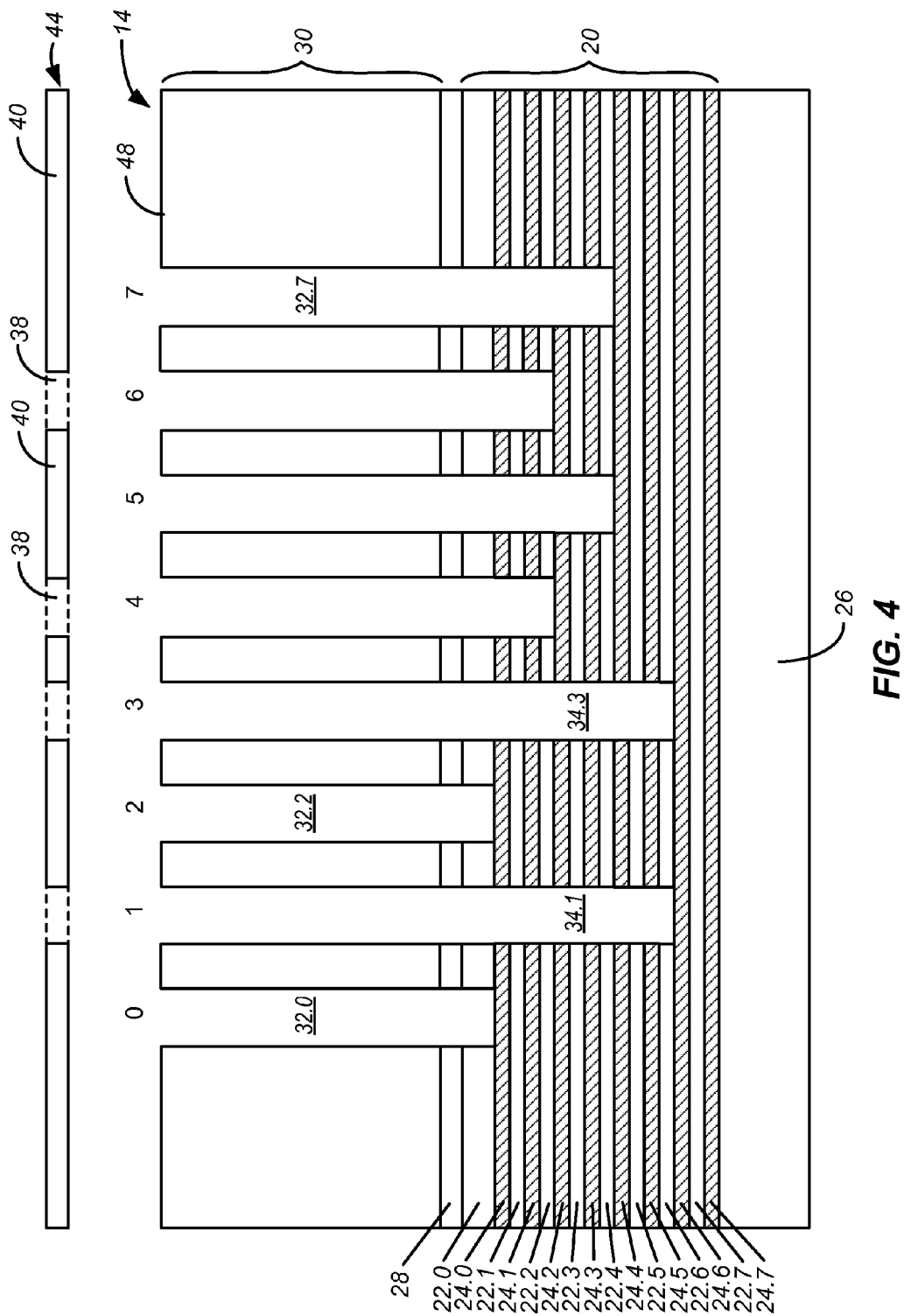
FIG. 4 illustrates a second photoresist mask used to etch through two electrically conductive layers through a second set of contact openings.
Figure 5:
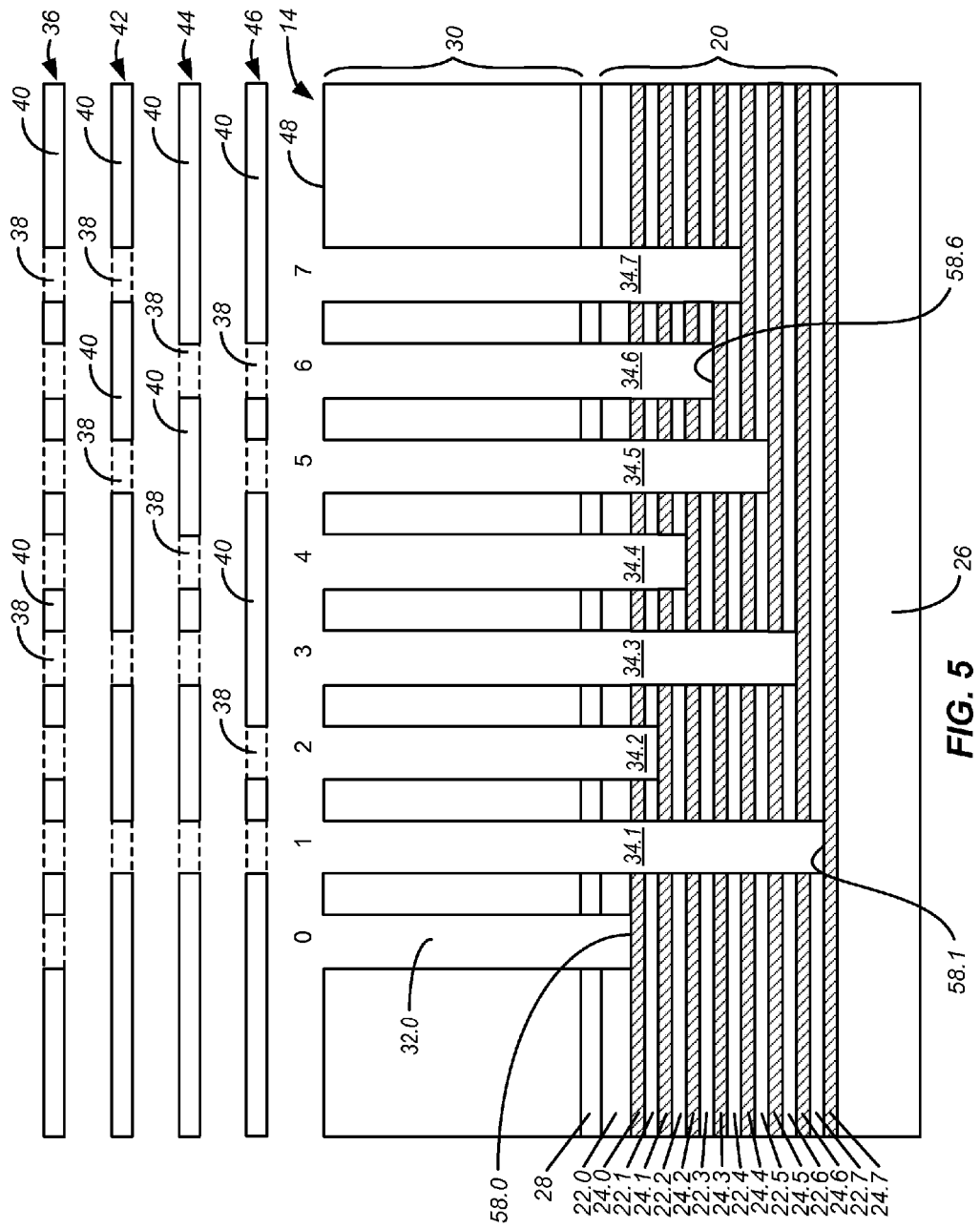

FIGS. 3-5 show vertical contact region 14 after etching using first, second and third photoresist masks 42, 44 and 46. As mentioned above with regard to FIG. 2, the images directed onto the surfaces of the conductive layers 24 can be smaller than images 41 to accommodate slight misalignments which can occur during the subsequent imaging and etching steps to help prevent erosion of the dielectric material surrounding contact openings 32. The etching process can be carried out using a single etch chemistry using, for example, timing mode etching. Alternatively, the etching process can be carried out using different etch chemistries to individually etch through different layers. While contact openings photoresist mask 36 includes open etch regions 38 for each of W electrically conductive layers 24, each of photoresist masks 42, 44 and 46 includes half that number, in this example 4, of open etch regions 38. With reference to FIG. 5, which shows all of masks 36, 42, 44 and 46, it is seen that each open region 38 for masks 42-46 is aligned with an appropriate contact opening 32. Etching using the first, second and third photoresist mask 42, 44, 46 can be carried out for silicon oxide/poly silicon layers using, for example, reactive ion etching using an etch chemistry, for example, including CF4/N2/CH2F2/HBR/He—O2/He, stopping on top of the appropriate electrically conductive layer 24.0-24.7.

First photoresist mask 42, shown in FIG. 3, is positioned above the upper surface 48 of hard mask 30 with open etch regions 38 aligned with contact openings 32.1, 32.3, 32.5 and 32.7 at locations 1, 3, 5 and 7. The material at the bottom of the contact openings 32 at locations 1, 3, 5 and 7 is exposed to images, not shown, from open etch regions 38 of first photoresist mask 42 and is then etched four levels through first electrically conductive layer 24.0 and second dielectric layer 22.1 to create the structure shown in FIG. 3. Next, as shown in FIG. 4, first photoresist mask 42 is removed and then second photoresist mask 44 is positioned above the resulting structure of FIG. 3 so that open etch regions 38 are aligned with contact openings 32.1, 32.3, 32.4 and 32.6 at locations 1, 3, 4 and 6. The structure at the bottoms of contact opening 32.1, 32.3, 32.4 and 32.6 is exposed to images, not shown, from open etch regions 38 of second photoresist mask 44 and is then etched two levels to create the structure shown in FIG. 4. Next, second photoresist mask 44 is removed and third photoresist mask 46 is positioned above the resulting structure of FIG. 4 so that open etch regions 38 are aligned with contact openings 32.1, 32.2, 32.5 and 32.6 at locations 1, 2, 5 and 6. The structure at the bottom of contact openings 32.1, 32.2, 32.5 and 32.6 is exposed to images, not shown, from open etch regions 38 of third photoresist mask 46 and is then etched one level to create the structure shown in FIG. 5, including contact opening 32.0 and the seven extended contact openings 34.1-34.7. The order of the etching using first, second, third photoresist mask 42, 44, 46 may be switched so that, for example, third mask 46 is used first, second mask 44 is used second and first mask 42 is used third.

FIG. 5A is a simplified, enlarged, somewhat exaggerated cross-sectional view of the contact opening at location 1. FIG. 5A illustrates how the contact opening between upper surface 48 of hard mask 30 and conductive layer 24.0 has a larger cross-sectional area than the contact opening between conductive layers 24.0 and 24.7. Also shown is the tapering of the contact openings from a larger cross-sectional area at the first, upper conductive layer 24.0 to a smaller cross-sectional area at the lower conductive layer 24.7.

Figure 6:
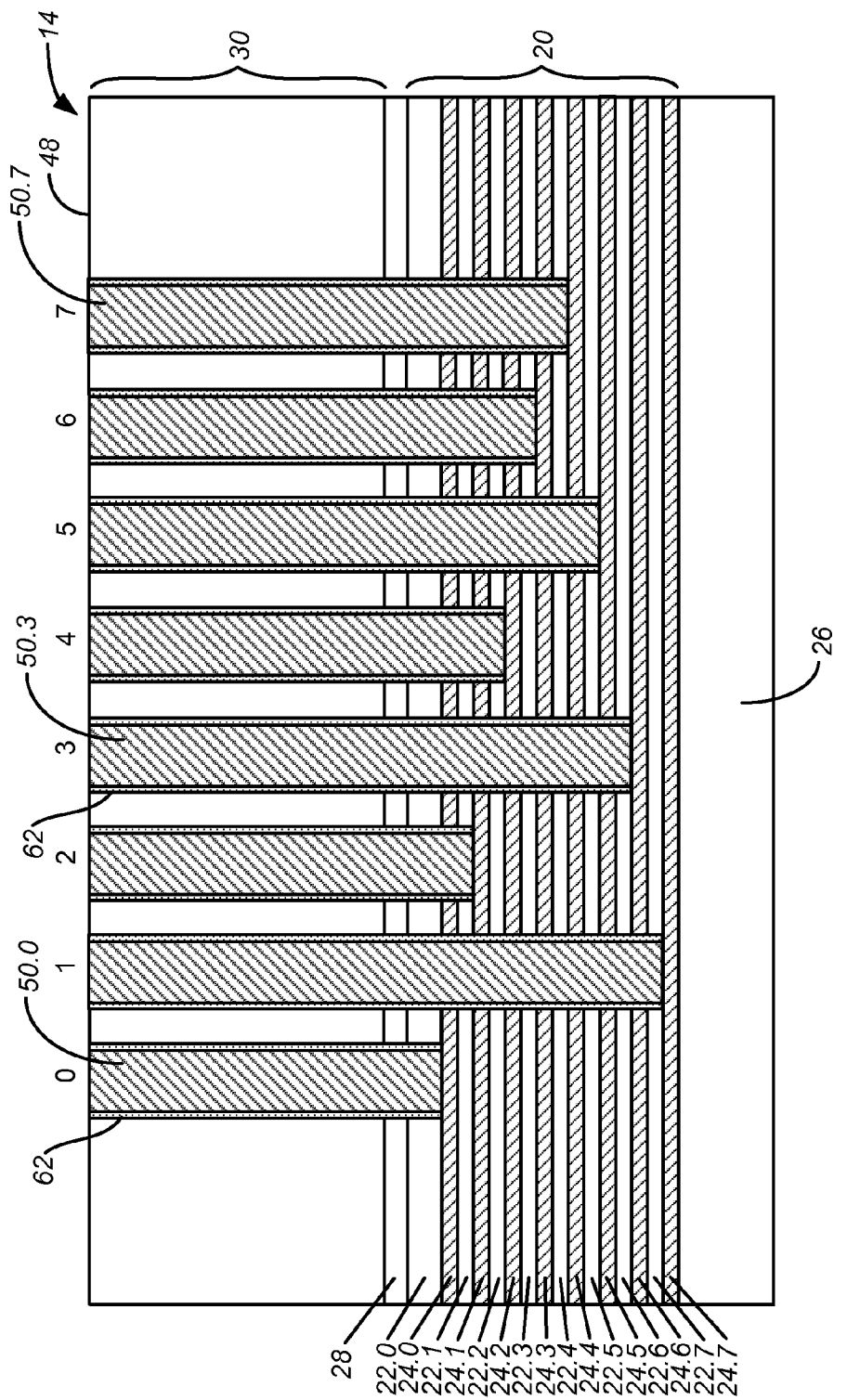
FIG. 6 shows the structure of FIG. 5 after interlayer connectors have been formed within the contact openings from the upper surface of the interlayer dielectric down to the electrically conductive layers.

FIG. 6 shows electrically conductive interlayer connectors 50, formed in contact opening 32.0 and extended contact openings 34.1-34.7 to provide electrical connection with electrically conductive layers 24.0, 24.1, 24.6, 24.2, 24.5, 24.3 and 24.4, respectively. Interlayer connectors 50 can be made of the same electrical conductor materials discussed above. However, doped Si, W and Cu may be preferred because of the existing knowledge about chemical mechanical polishing of these electrically conductive materials. Interlayer connectors 50 are identified as interlayer connectors 50.0-50.7 corresponding to locations 0-7.

In some examples, it may be desired that interlayer connectors 50 be insulated from the electrically conductive layers 24 that they pass through. This can be accomplished by, for example, fully or partially lining all or some of the interiors of extended contact openings 34.1-34.7 with a dielectric material. FIG. 6 illustrates an example in which each of contact openings 32 and extended contact openings 34 are lined with a dielectric isolation sleeve 62. Doing so insulates the interlayer connectors 50 from the electrically conductive layers 24 through which the interlayer connectors pass. See, for example, U.S. patent application Ser. No. 13/451,411, filed 19 Apr. 2012.

In use, spaced apart contact openings 32 are created through a dielectric layer including, in this example, hard mask 30, etch stop layer 28 and a first dielectric layer 22. The creation of contact openings 32 provides a pattern of openings for the subsequent etching steps. Contact openings 32 are formed so that dielectric layer material separates the contact openings and the contact openings overlie an electrically conductive layer 24 for each of W (8 in this example) electrically conductive layers. Contact openings 32 are formed down to first electrically conductive layer 24.0. In this example, contact openings 32 are made using contact opening photoresist mask 36; other procedures for making contact openings 32 may also be used.

A set of N etch masks are used with $2^{N-1}$ being less than W and $2^N$ being greater than or equal to W. For example, with N equal to 3, the 3 masks can be used to create 7 extended contact openings 34, one for each of the 7 electrically conductive layers 24 below the first electrically conductive layer 24.0. Each etch mask 42, 44 and 46 has separate open etch regions 38, positioned to overlie selected contact openings 32, and mask regions 40, which cover hard mask 30 elsewhere.

The etching, using the N etch masks, takes place only through the contact openings 32 to create the extended contact openings 34 extending to landing areas 58 at the electrically conductive layers 24. Thus, landing areas 58 are found at the lower ends of contact opening 32.0 and extended contact openings 34.1-34.7. This etching is carried out in a manner such that the dielectric material surrounding contact openings 32 is substantially unaffected so that only a relatively small amount of sidewall material surrounding contact openings 32 is removed during the etching steps. One example of this includes forming the contact openings between upper surface 48 of hard mask 30 and conductive layer 24.7 to have larger cross-sectional areas than the contact opening between conductive layers 24.0 and 24.6.

During typical operations half of the contact openings 32 are etched during each etching step. For example, when five photoresist masks are used to etch through 31 contact openings to reach 31 different electrically conductive layers 24, each mask will be used to etch half (16) of the contact openings. However, when the number of electrically conductive layers 24 which can be etched is greater than the number of electrode conductive layers which are etched, such as when five photoresist masks are used to etch through 29 contact openings to reach 29 different electrically conductive layers 24, at least some of the masks will not be used to etch to half of the contact openings, but rather the photoresist masks will be used to etch up to half of the contact openings, sometimes referred to as effectively half of the contact openings. Therefore, during each etching step $2^{n-1}$ electrically conductive layers are etched for up to half of the contact openings for each etch mask n=1, 2 . . . N.

The etching steps are carried out so that each contact opening 32 is etched with a different combination of the open etch regions 38 of the etch masks, in this example the first, second and third etch masks 42, 44, 46. Subsequently, interlayer connectors 50 are formed within the extended contact openings 34 to electrically connect to each of the electrically conductive layers 24.

In some examples, the shapes of the perimeters of open etch regions 38 are similar to the shape of the perimeters of contact openings 32 and extended contact openings 34, such as both generally square.

It can be appreciated that the illustrated shapes are idealized shapes. Instead of the generally square shape illustrated in FIG. 2A, other examples can create other cross-sectional shapes, including round, oval and rectangular.

In the disclosed example of FIGS. 2-5, the first contact opening 32.0 is not etched using etch masks 42, 44, 46. The second contact opening 32.1 is etched through 7 electrically conductive layers 24 using all three etch masks 42, 44, 46. The third contact opening 32.2 is etched through 1 electrically conductive layer 24 using etch mask 46. The fourth contact opening 32.3 is etched through 6 electrically conductive layers 24 using etch masks 42 and 44. The fifth contact opening 32.4 is etched through 2 electrically conductive layers 24 using etch mask 44. The sixth contact opening 32.5 is etched through 5 electrically conductive layers 24 using etch masks 42 and 46. The seventh contact opening 32.6 is etched through 3 electrically conductive layers 24 using etch masks 44 and 46. The eighth contact opening 32.7 is etched through 4 electrically conductive layers 24 using 1 etch mask 42.

As is evident from FIGS. 5 and 6, in some examples, the contact openings etching step can be carried out so that at least some interlayer connectors 50 terminate at electrically conductive layers 24 located at least two levels from the electrically conductive layers 24 to which adjacent interlayer connectors 50 terminate. See for example, interlayer connector 50 at location 1 versus the adjacent interlayer connectors at locations 0 and 2. Doing this, as well as providing a pattern of images such as shown in FIG. 2A, facilitates contact enlargement between said at least some interlayer connectors 50 and their electrically conductive layers 24 because there is more space between contacts. Such arrangement leaves more process window for achieving the deepest contact opening without losing the isolation to the neighbor contact openings.

While in some examples it may be preferred that the cross-sectional area of the contact openings at surface 48 all be generally equal, in practice the deeper the contact opening, the greater the cross-sectional area of the contact opening at surface 48. The cross-sectional area for the shallowest contact opening at surface 48, typically one extending only to conductive layer 24.0, can be about the same as the cross-sectional area of the contact opening at conductive layer 24.0. However, for the deepest contact openings, the cross-sectional area at surface 48 may be 100% larger than, or in some cases may be even 400% larger than, the cross-sectional area at conductive layer 24.0.

Figure 7:
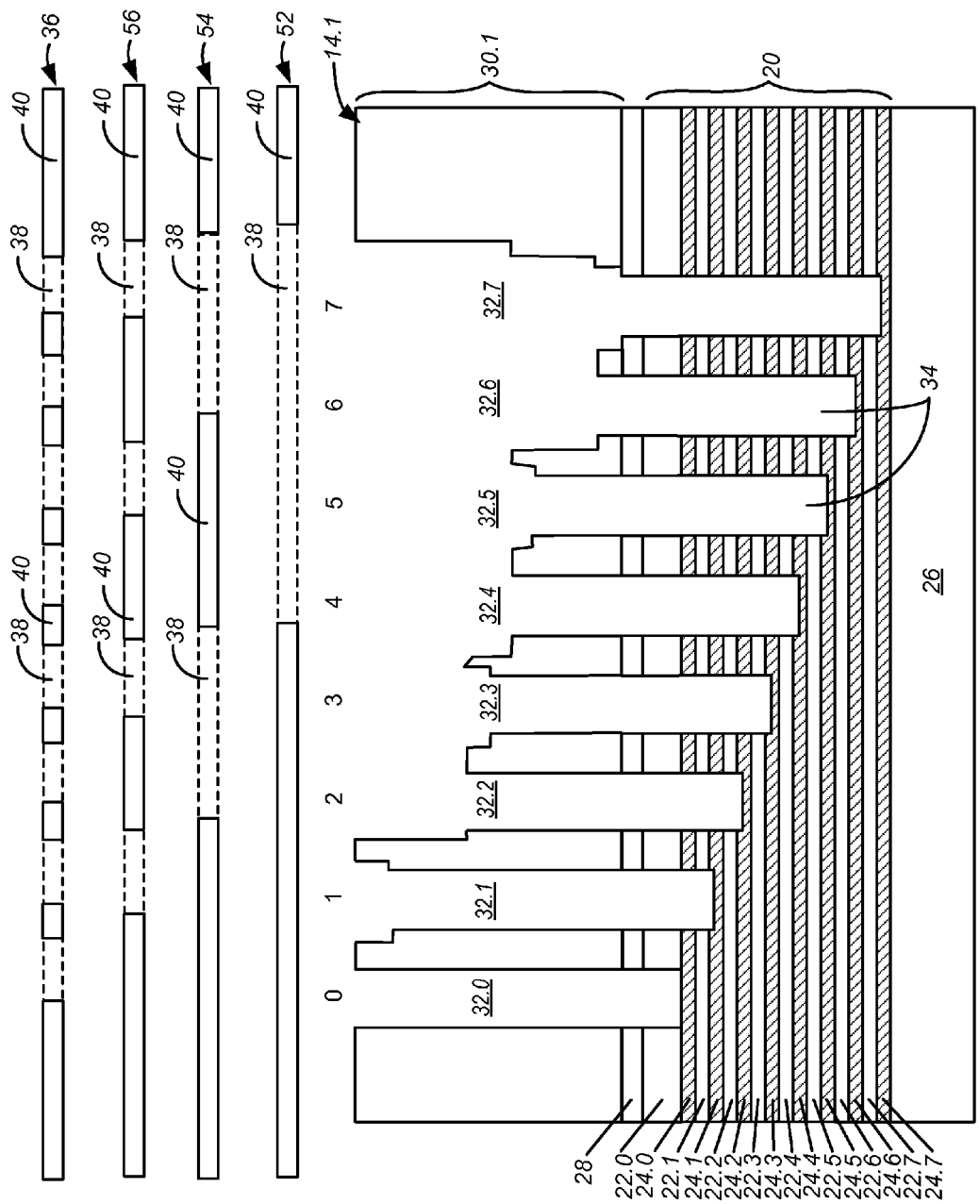
FIG. 7 is similar to FIG. 5 but shows an example of what can happen when you use first, second and third photoresist masks with a different scheme for the size and numbers of open etch regions to create extended contact openings.

It is typical that the pitch, that is the center to center distance between contact openings, be a constant distance. However, for efficiency it is also desired to keep the pitch to a minimum distance. However, if two relatively deep contact openings were positioned adjacent to one another, because of the relatively large cross-sectional areas of the relatively deep contact openings at the upper surface 48, the amount of interlayer dielectric 30 separating them could become sufficiently small to compromise the integrity of the device. However, this problem can be minimized by arranging the contact openings so that (1) the deepest contact opening (and thus the deepest interlayer connector 50 which would typically have the largest or one of the largest cross-sectional areas at surface 48) is next to the shallowest contact opening (and thus the shallowest interlayer connectors 50 which would typically have the smallest or one of the smallest cross-sectional areas at surface 48), (2) the next deepest contact openings are next to the next shallowest contact openings, (3) and so forth until the contact openings of about the same depth are next to each other. A relatively simple example of this is illustrated in FIG. 6. The shallowest interlayer connector 50.0 at location 0 is next to the deepest interlayer connector 50.1 at location 1, the next shallowest interlayer connector 50.2 at location 2 is between the deepest interlayer connector 50.1 and the next deepest interlayer connector 50.3 at location 3, and so forth. This can be achieved through various examples of the invention by the appropriate alignment of open etch regions 38 while still minimizing the number of etching steps as discussed above Another advantage of some examples of the invention will be evident from the comparison of FIGS. 5 and 7 with like elements referred to with like reference numerals. FIG. 7 is similar to FIG. 5 but uses first, second and third photoresist masks 52, 54 and 56 with a different scheme for the size and numbers of open etch regions 38. First photoresist mask 52 of FIG. 7 has one open etch region 38 covering half (4 in this example) of the contact openings 32 and the hard mask 30.1 therebetween. First photoresist mask 52 also has one closed mask region 40 covering the other contact openings and the hard mask 30.1 therebetween. Second photoresist mask 54 has two open etch regions 38 and two closed mask regions 40 each alternatingly covering one fourth (2 in this example) of the contact openings 32 and the hard mask 30.1 therebetween. Third photoresist mask 56 has four open etch regions 38 and four closed mask region 40, each alternatingly covering one eighth (1 in this example) of the contact openings 32.

The process used with the example of FIG. 7 creates a severely degraded hard mask 30.1, acting as an oxide hard mask, which must be removed before further processing. Removal processes are both complex and costly. Therefore, another advantage of various examples of the present invention is that they effectively eliminate the need to remove hard mask 30 after the creation of extended contact openings 34.

The process discussed above with regard to FIG. 7 for creating extended contact openings 34 can also be referred to as a binary process, based on $2^0 \ldots 2^{n-1}$ with n being the number of etching steps. That is, first photoresist mask 52 alternatingly covers $2^0$ contact openings 32 and exposes $2^0$ contact openings 32; second photoresist mask 54 alternatingly covers $2^1$ contact openings 32 and exposes $2^1$ contact openings 32; third photoresist mask 56 alternatingly covers $2^2$ contact openings 32 and exposes $2^2$ contact openings 32; and so on. Using this binary process, n masks can be used to provide access to $2^n$ contact openings 32 for $2^n$ electrically conductive layers 24.

Further information on similar techniques and methods for creating contact openings 32 and extended contact openings 34 are disclosed in U.S. patent application Ser. No. 13/049,303, filed 16 Mar. 2011, entitled REDUCED NUMBER OF MASK FOR IC DEVICE WITH STACKED CONTACT LEVELS; in U.S. patent application Ser. No. 13/114,931, filed 24 May 2011, entitled MULTILAYER CONNECTION STRUCTURE AND MAKING METHOD; in U.S. patent application Ser. No. 13/451,411, filed 19 Apr. 2012, entitled METHOD FOR CREATING A 3D STACKED MULTICHIP MODULE; in U.S. patent application Ser. No. 13/451,428, filed 19 Apr. 2012, entitled INTEGRATED CIRCUIT CAPACITOR AND METHOD, the disclosures of which are incorporated by reference. These four applications and the present application have a common assignee.

The present invention can be used with a wide range of integrated circuit devices including, for example, 3-D NAND Flash memory, and can be features of integrated circuits including, for example, through silicon via (TSV) structures or micro fluid heat sink/dissipative structures.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. For example, in some examples, it may be desired to have more than one interlayer connector 50 extends to the same conductive layer 24. This can be achieved by simply duplicating the open etch regions 38 in the appropriate photoresist mask 42, 44 and 46 to create the additional extended contact openings 34 at the desired locations. For example, to have a second interlayer connector 50 extend to conductive layer 24.3, an additional set of aligned open etch regions 38 can be provided in second and third photoresist masks 44 and 46 without the need to change the above-described etching sequence.

Disclosures of any and all patents, patent applications and printed publications referred to above are incorporated by reference.

What is claimed is:

1. A method, for use with an integrated circuit device including a stack of dielectric/conductive layers, for forming interlayer connectors extending from a surface of the device to the conductive layers, the method comprising:
creating spaced apart contact openings in a contact region of the integrated circuit through a dielectric layer with dielectric layer material separating each of the contact openings, the contact openings overlying an electrical conductor for each of W conductive layers;
the contact openings creating step comprising creating a first contact opening down to a first conductive layer;
using a set of N etch masks with $2^{N-1}$ being less than W and $2^N$ being greater than or equal to W, the etch masks having mask regions and spaced apart open etch regions corresponding to selected contact openings;
etching, using the N etch masks, the stack of dielectric/conductive layers only through W−1 contact openings to create extended contact openings extending to W−1 conductive layers;
the etching step comprising etching $2^{n-1}$ conductive layers for up to half of the contact openings for each etch mask n=1, 2 . . . N;
the etching step being carried out so that the contact openings are etched with different combinations of the open etch regions of said etch masks; and
forming interlayer connectors in the first contact opening and the extended contact openings to electrically connect to each of the conductive layers.

2. The method according to claim 1, wherein:
the contact openings creating step creates contact openings having a range of depths from a deepest contact opening to a shallowest contact opening;
the cross-sectional area of the deepest contact opening at an upper surface of the dielectric layer being about 0-400% larger than the cross-sectional area of the shallowest contact opening at the first conductive layer.

3. The method according to claim 1, wherein:
the contact openings creating step creates contact openings having a range of depths from a deepest contact openings to a shallowest contact opening;
the cross-sectional area of the deepest contact opening at an upper surface of the dielectric layer being about 0-100% larger than the cross-sectional area of the shallowest contact opening at the first conductive layer.

4. The method according to claim 1, wherein the creating step is carried out and the N etch masks are configured so that the dielectric material surrounding the contact openings is substantially unaffected during the etching step.

5. The method according to claim 1, wherein the etch masks using step and the etching step are carried out so that the perimeters of the contact openings and the extended contact openings have similar shapes.

6. The method according to claim 1, wherein the contact openings creating step comprises forming the contact openings through a dielectric layer comprising an interlayer dielectric and an etch stop layer.

7. The method according to claim 1, wherein:
the first contact opening is not etched during said etching step;
a second contact opening is etched through 7 electrically conductive layers using 3 etch masks with n=1, 2 and 3;
a third contact opening is etched through 1 electrically conductive layer using 1 etch mask with n=1;
a fourth contact opening is etched through 6 electrically conductive layers using 2 etch masks with n=2 and 3;
a fifth contact opening is etched through 2 electrically conductive layers using 1 etch mask with n=2;
a sixth contact opening is etched through 5 electrically conductive layers using 2 etch masks with n=1 and 3;
a seventh contact opening is etched through 3 electrically conductive layers using 2 etch masks with n=1 and 2; and
an eighth contact opening is etched through 4 electrically conductive layers using 1 etch mask with n=3.

8. The method according to claim 7, wherein:
W=8 and N equals 3.

9. The method according to claim 7, wherein:
the first through eighth contact openings are arranged in numerical order so that the second contact opening is between the first and third contact openings, the third contact opening is between the second and fourth contact openings, and so forth.

10. The method according to claim 1, wherein:
the contact openings etching step is carried out so that at least some interlayer connectors terminate at electrical conductors located at least two levels from the electrical conductors to which adjacent interlayer connectors terminate.

11. The method according to claim 1, wherein the etching step is carried out so that:
the interlayer connectors have a range of depths from greater depths to average depths to shallower depths;
a first interlayer connector having a greater depth is adjacent to a second interlayer connector having a shallower depth;

third and fourth interlayer connectors having average depths are adjacent to one another.

12. The method according to claim 11, wherein the etching step is carried out so that the first interlayer connector has a greatest depth and the second interlayer connector has a shallowest depth.

13. The method according to claim 11, wherein the etching step is carried out so that:
the two interlayer connectors having the two greatest depths are not adjacent to one another; and
the two interlayer connectors having the two shallowest depths are not adjacent to one another.

14. The method according to claim 11, wherein the contact openings creating step comprises locating the contact openings so that the interlayer connectors are separated from one another by a substantially constant pitch.

15. The method according to claim 1, wherein the contact openings creating step comprises locating the contact openings so that the interlayer connectors are separated from one another by a substantially constant pitch.

16. An integrated circuit device comprising:
a stack of alternating dielectric layers and electrically conductive layers including upper and lower electrically conductive layers;
an overlying layer over the upper electrically conductive layer, the overlying layer having an upper surface;
interlayer connectors extending from the upper surface of the overlying layer to respective ones of the electrically conductive layers to make electrical contact therewith, the interlayer connectors including first, second, third and fourth interlayer connectors;
the interlayer connectors separated from one another by an average pitch;
the interlayer connectors have a range of depths from greater depths to average depths to shallower depths;
the first interlayer connector, having a greater depth, being adjacent to the second interlayer connector, having a shallower depth;
the third and fourth interlayer connectors, having generally average depths, being adjacent to one another.

17. The integrated circuit device according to claim 16, wherein the first interlayer connector has the greatest depth among the interlayer connectors, and the second interlayer connector has the shallowest depth among the interlayer connectors.

18. The integrated circuit device according to claim 16, wherein:
the two interlayer connectors having the two greatest depths are not adjacent to one another; and
the two interlayer connectors having the two shallowest depths are not adjacent to one another.

19. The integrated circuit device according to claim 16, wherein the pitch between adjacent interlayer connectors is a substantially constant pitch.

* * * * *